United States Patent [19]
Heyerdahl
[11] 3,775,262
[45] Nov. 27, 1973

[54] METHOD OF MAKING INSULATED GATE FIELD EFFECT TRANSISTOR

[75] Inventor: Norman E. Heyerdahl, Dayton, Ohio
[73] Assignee: The National Cash Register Company, Dayton, Ohio

[22] Filed: Feb. 9, 1972
[21] Appl. No.: 224,796

[52] U.S. Cl. ................ 204/15, 148/187, 317/234 R
[51] Int. Cl. ................ C23b 5/48
[58] Field of Search ................ 204/15; 148/186, 148/187; 317/234 R

[56] References Cited
UNITED STATES PATENTS

| | | | |
|---|---|---|---|
| 3,634,203 | 1/1972 | McMahon | 204/15 |
| 3,690,966 | 9/1972 | Hayashi | 148/187 |
| 3,642,545 | 2/1972 | Pammer | 148/187 |
| 3,351,825 | 11/1967 | Vidas | 317/234 |

*Primary Examiner*—T. Tufariello
*Attorney*—J. T. Cavender et al. and L. P. Benjamin

[57] ABSTRACT

The present invention relates to an insulated gate field effect transistor and method of making same.

An aluminum film is evaporated on a silicon wafer. Portions of the aluminum film are masked. The unmasked portions are anodized. The unanodized portions are removed leaving the anodized insulative portions thereon. Dopant atoms are diffused into areas of the silicon wafer which are not covered by the anodized insulative layer. The anodized insulative layer acts as a diffusion mask, to form source and drain regions in the silicon wafer, and to thus delineate a gate insulator layer between the source and drain regions by the act of diffusion. A second aluminum film is evaporated over the silicon wafer. The portions of the areas of the second aluminum film over the source and drain regions, and the area of the second aluminum film over the aligned gate insulator layer are masked. The unmasked portions of the second aluminum film are anodized to delineate an aligned gate electrode over the aligned gate insulator layer and to delineate source and drain electrodes in contact with the source and drain regions. An insulated gate field effect transistor is thus formed.

6 Claims, 28 Drawing Figures

METHOD OF MAKING INSULATED GATE FIELD EFFECT TRANSISTOR

BACKGROUND OF THE INVENTION:

J. L. Janning in U.S. Pat. No. 3,445,732 discloses a thin film field effect transistor and method of making same. The outer surface of an aluminum gate electrode is incompletely anodized prior to the evaporation of a semiconductor material thereon. Janning partially anodizes the gate electrode to form the gate insulator layer of the thin film transistor upon the aluminum gate electrode of the thin film transistor.

In the method of the present invention unmasked areas of the aluminum film are completely anodized to form nonconductive areas which separate masked conductive areas. The conductive areas may be used to form conductors of a metal-oxide-semiconductor field effect transistor. The nonconductive areas may be used as a diffusion mask or as an aligned gate insulator layer of a metal-oxide-semiconductor field effect transistor.

Janning does not suggest the use of both chemical and electrical masking during anodization to form an aligned gate electrode above an aligned gate insulator layer of a metal-oxide-semiconductor field effect transistor.

In the method of the present invention an anodization step is used to form an aligned gate electrode over an aligned gate insulator layer. The portion of an aluminum film over the aligned aluminum oxide gate insulator layer is masked, so that said portion will not be anodized whereas the unmasked portion of the aluminum film will be anodized. An aligned gate electrode is thus formed from the masked aluminum film.

In a prior step, another aluminum film is anodized to form a diffusion mask to form diffused source and drain regions. A part of the diffusion mask subsequently acts as an aliged gate insulator layer of a metal-oxide-semiconductor (MOS) field effect transistor. The aluminum oxide film remains chemically and dimensionally stable at a diffusion temperature.

The field effect transistor made by the above method has an aligned gate insulator layer and a gate electrode thereabove. There is thus little capacitance between the gate insulator layer and its source and drain regions. The field effect transistor so formed thus has a fast response to the application of a gate voltage thereto.

SUMMARY OF THE INVENTION:

The present invention relates to a method of forming second conductivity source and drain regions of a metal-oxide-semiconductor field effect transistor to be formed in a first conductivity semiconductor substrate, comprising: forming a metal film on said first conductivity semiconductor substrate; masking selected areas of said metal film with an anodization mask, under which selected areas second conductivity source and drain regions are to be formed in said first conductivity semiconductor substrate; anodizing exposed areas of said selectively masked metal film, to form electrically insulative film areas on said first conductivity semiconductor substrate; removing the anodization mask from the unanodized portions of said metal film; removing the unanodized portions of the metal film from said first conductivity semiconductor substrate to leave an electrically insulative diffusion mask on said first conductivity semiconductor substrate; and diffusing selected dopant atoms through said electrically insulative diffusion mask into said first conductivity semiconductor substrate at areas of said first conductivity semiconductor substrate to form said second conductivity source and drain regions in selected areas of said first conductivity semi-conductor substrate, with an electrically insulative gate insulator layer being between said formed source and drain regions.

An object of the present invention is to provide a method of forming source and drain regions to either side of an aligned gate insulator layer of a metal-oxide-semi-conductor field effect transistor.

Another object of the present invention is to provide a method of forming an aligned gate electrode of a metal-oxide-semiconductor field effect transistor by using a low temperature anodization step.

Another object of the present invention is to provide a metal-oxide-semiconductor field effect transistor which has a fast electrical response to a gate voltage applied thereto.

Figures 1A, 1B, 1C, 1D, 1E, 2A, 2B, 2C, 2D, 2E:
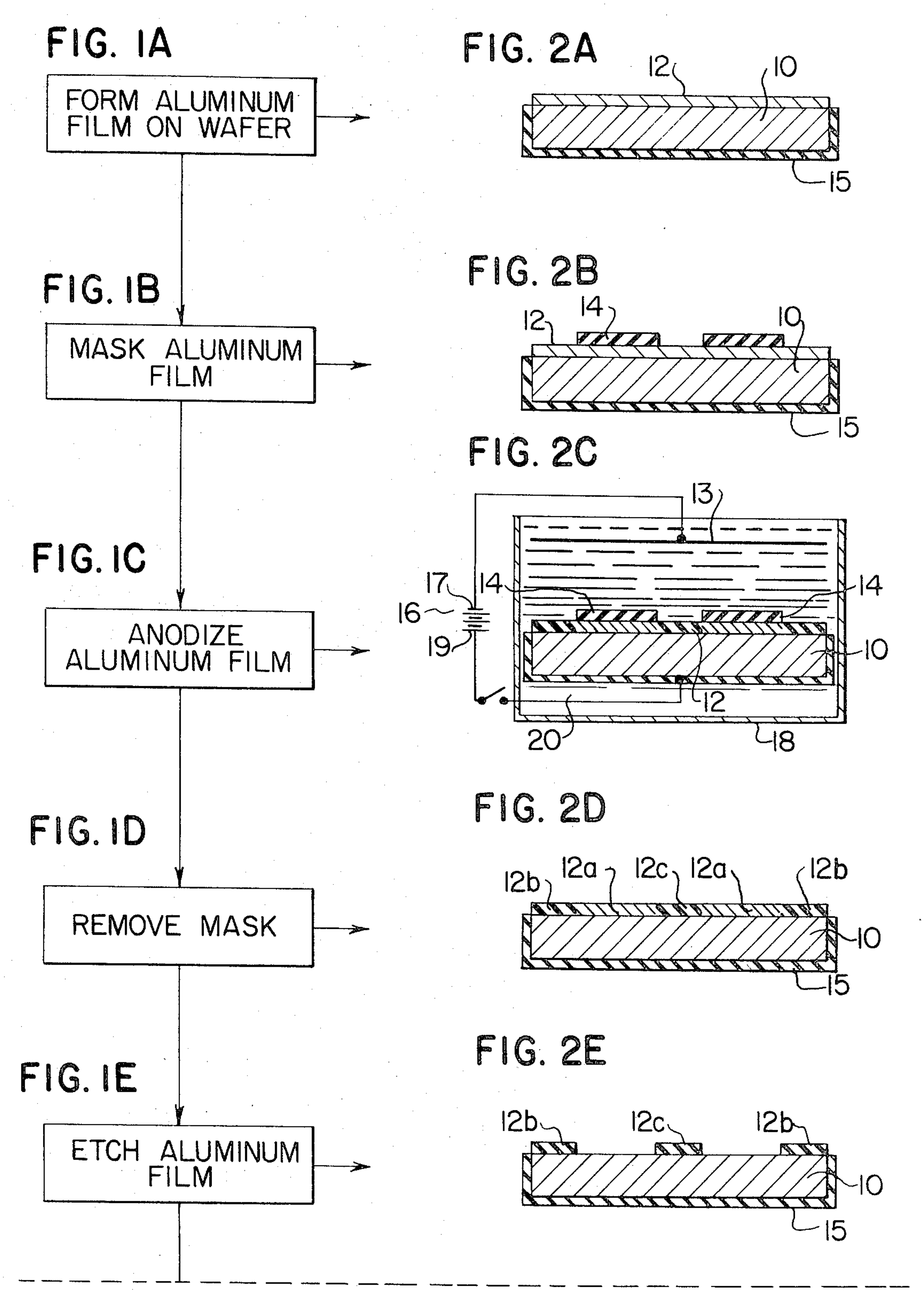
FIGS. 1A to 1N show the sequence of processing steps as a flow chart to form a metal-oxide-semiconductor field effect transistor by the method of the present invention.
FIGS. 2A to 2N are sectional views of a metal-oxide-semiconductor field effect transistor corresponding to the processing steps of FIGS. 1A to 1N.
Figures 1F, 1G, 1H, 1I, 1J, 2F, 2G, 2H, 2I, 2J:
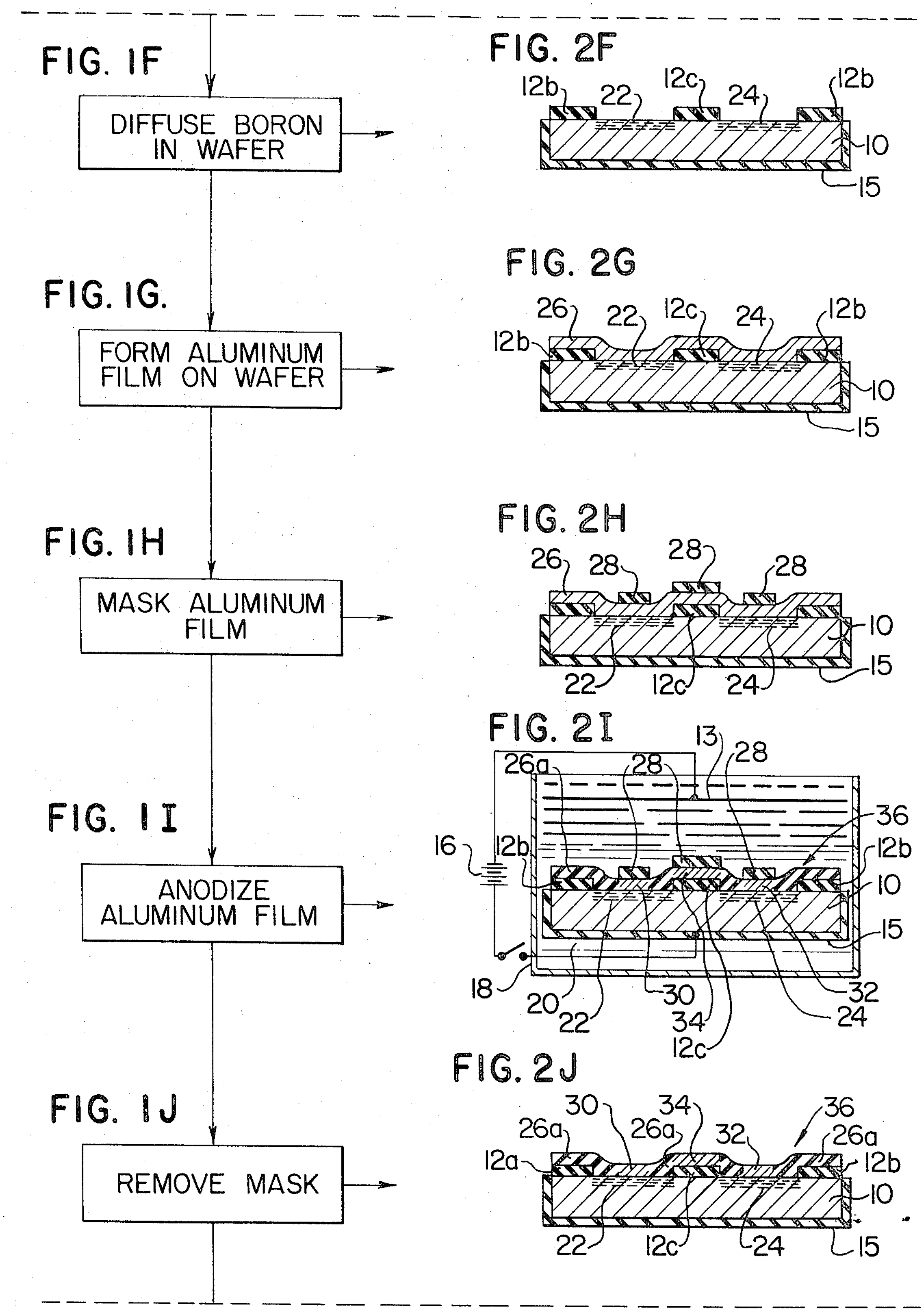

DESCRIPTION OF THE PREFERRED EMBODIMENT:

FIGS. 1A to 1N and 2A to 2N taken together show the method of the present invention. As shown in FIG. 2A, and N-type wafer 10 has a first aluminum film 12 evaporated thereon. The back side of the silicon wafer 10 is protected by an acid resistive coating 15, such as a photo-resist coating. The aluminum film 12 may be approximately 2,000 angstroms thick. The aluminum film 12 may be evaporated in an evaporation chamber. As shown in FIGS. 1B and 2B, an anodization mask 14, such as a 10,000 angstrom thick photoresist anodization mask, is selectively formed over areas of the wafer 10, in which doped source 22 and drain regions 24 are to be formed as shown in FIG. 2F. As shown in FIGS. 1C and 2C, the first aluminum film 12 is selectively anodized by connecting the cathode 17 of a constant voltage power supply, such as a battery 16, to a cathode plate 13, such as an aluminum cathode plate, and the anode 19 of the battery 16 to the semiconductor substrate 10. The aluminum film 12 is anodized in a container 18 which has an anodization solution 20, such as a mixture of oxalic acid and propylene glycol, therein. The anodization solution 20 should be free of sodium, boron and phosphorous impurities to prevent inclusion of these elements into a fabricated MOS field effect transistor. The aluminum film 12 is not anodized beneath the mask 14. As shown in FIGS. 1C and 2C, portions of the film 12 are completely anodized into aluminum oxide films **12*b* and 12 c. The aluminum oxide film 12c** will become an aligned gate insulator layer.

As shown in FIGS. 1D and 2D the anodization mask 14 is stripped from the aluminum film **12*a* thereunder, by a suitable photoresist stripper. As shown in FIGS. 1E and 2E, the aluminum film 12*a* is etched from the silicon wafer 10 with a mild acid, such as dilute hydrochloric acid, to form an aluminum oxide diffusion mask 12*b*** and 12*c*. The dilute hydrochloric acid does not remove the aluminum oxide diffusion masks 12*b* and 12*c*.

As shown in FIGS. 1F and 2F, boron is diffused into the silicon wafer 10 in areas of the surface of the silicon wafer 10 not covered by aluminum oxide diffusion masks 12*b* and 12*c*. The boron may be diffused from a gaseous atmosphere at high temperature or from a doped colloidal silicon dioxide dispersion at a somewhat lower temperature. The colloidal silicon dioxide may be spun onto the silicon wafer 10. Thus a P-type source region 22 and a P-type drain region 24 are formed in the N-type silicon wafer 10. The gate insulator layer 12c is thus very accurately aligned between the P-type source and drain regions 22 and 24, since it has served as a diffusion mask.

As shown in FIGS. 1G and 2G, a second aluminum film 26, which is to be used to make electrical contact to the source and drain regions 22 and 24, and as an aligned gate electrode above the aligned aluminum oxide gate insulator layer 12c, is evaporated over the aluminum oxide masks 12b and 12c, and on to the silicon wafer 10. The aluminum film 26 may be approximately 20,000 angstroms thick.

As shown in FIGS. 1H and 2H, the aluminum film 26 is selectively masked with a photoresist anodization mask 28. The photoresist mask is visually aligned through the use of alignment marks present on the masks of FIGS. 1B, 1H and 1L. The photoresist mask 28 is used to form an aligned gate electrode 34, and to form source and drain electrodes 30 and 32 in contact with the source and drain regions 22 and 24. The gate electrode mask will be aligned within the alignment tolerance of approximately 0.0001 inches, as is customary in this art.

As shown in FIGS. 1I and 2I, the battery 16 is again connected between the silicon wafer 10 and the cathode plate 13. The areas of the aluminum film 26 not covered by the anodization mask 28 are anodized into aluminum oxide insulation 26*a* in the anodizing solution 20. The anodization undercuts the masked regions over to the edge of the gate insulator layer 12*c*. Source electrode 30 and drain electrode 32 are formed between the aligned aluminum oxide gate insulator layer 12*c*. The gate electrode 34 is accurately aligned with the edge of the gate insulator layer 12*c* so as to only slightly overlap the edge of the source region 22 and the edge of the drain region 24. This aligned gate electrode 34 allows for fast electrical response of the fabricated MOS field transistor 36 of FIG. 2I, due to a low capacitance between the aligned gate electrode 34 and the source and drain regions 22 and 24. This aligned gate electrode 34 allows for the manufacture of a small MOS device. More MOS devices may be therefore built in a silicon wafer 10.

As shown in FIGS. 1J and 2J, the photoresist anodization mask 28 is removed to provide a MOS field effect transistor 36.

Figures 1K, 1L, 1M, 1N, 2K, 2L, 2M, 2N:
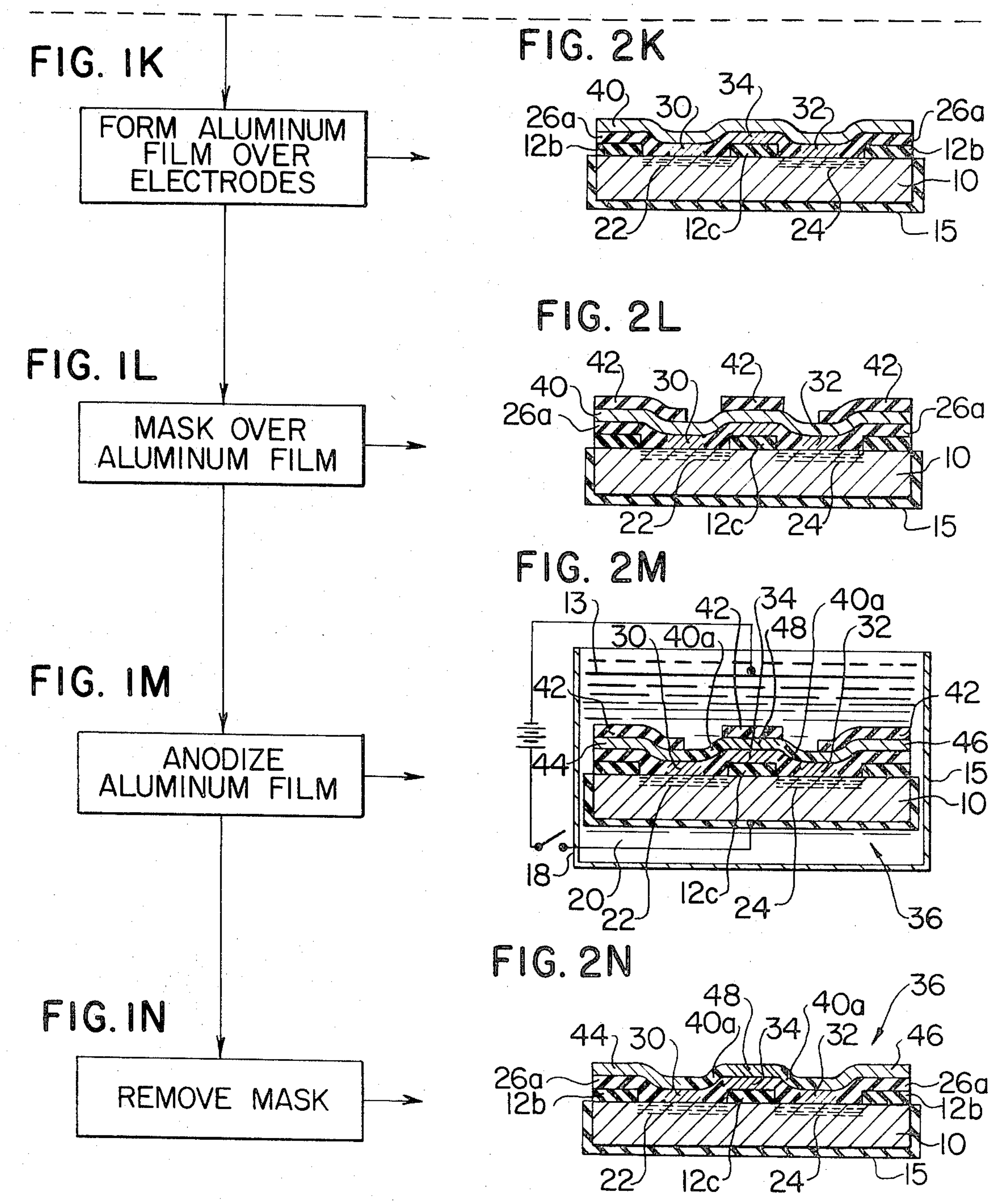

FIGS. 1K and 2K show the formation of a third aluminum film 40 upon the insulator regions 26*a*, in contact with the source and drain electrodes 30 and 32 and in contact with the aligned gate electrode 34. The aluminum layer 40 is used to make electrical interconnection with the source, drain and aligned gate electrodes of the MOS transistor 36 and other MOS transistors formed in silicon wafer 10. The third aluminum film 40 is used to form these interconnections.

FIGS. 1L and 2L show a mask 42 formed over portions of the aluminum film 40 which are to act as interconnections in contact with the source, drain and aligned gate electrodes 30, 32 and 34. Unmasked portions of the third aluminum film 40 are anodized to delineate insulation regions 40a of FIG. 2M and to form interconnections 44, 46 and 48 to each of the source, drain and aligned gate electrodes 30, 32 and 34 of the MOS field effect transistor 36 as a result of the insulation formed by anodization between the interconnections 44, 46 and 48.

FIGS. 1M and 2M show the anodization of the aluminum film 40. The anodization is carried out in a container 18 having an anodization solution 20 therein. The battery 6 has its anode connected to the semiconductor substrate 10. The portion of the aluminum film 40 which is not under the mask 42 is converted into aluminum oxide insulation 40*a*. A portion of the aluminum film 40 which is under mask 42 remains unanodized. The unanodized portion of the aluminum film 40 forms the interconnections 44, 46 and 48. Interconnection 44 makes contact with the source electrode 30. Interconnection 46 makes contact with a drain electrode 32 and the interconnection 48 makes contact with the aligned gate electrode 34. Thus FIG. 2M shows MOS field effect transistor 36 with interconnections 44, 46 and 48 connected to the source, drain and gate electrodes 30, 32 and 34.

As shown in FIG. 1N and 2N the mask 42 is removed from above the interconnections 44, 46 and 48. A completed MOS transistor 36, with interconnections, is shown in FIG. 2N.

The MOS field effect transistor 36 of FIG. 2N has a fast conduction response between its source and drain electrodes 30 and 32 when a gate voltage is applied to its gate electrode 34, due to the gate electrode 34 being aligned between the source and drain regions 22 and 24. The electrical characteristics of the MOS field transistor 36 are good due to the use of mostly low temperature processing steps in its formation. In fact only one high temperature processing step, namely, the diffusion of boron as shown in FIGS. 1F and 2F, is used. Thus little thermal strain is put on the silicon wafer 10 during formation of the MOS field effect transistor 36. Since less strain is put on silicon wafer 10, fewer dislocations can occur in the crystal 10. The electrical performance of MOS field effect transistor 36 is thus improved. The MOS field effect transistor 36 has little gate to source capacitance and little gate to drain capacitance due to an aligned gate insulator layer 12c and upper gate electrode 34 being therein.

What is claimed is:

1. A method of forming a precisely aligned gate insulator layer between two spaced regions of second type semiconductivity formed in one of two major exposed surfaces of a substrate of semiconductor material having first type semiconductivity comprising:

a. disposing a layer of a metal on the one of two major opposed surfaces of the substrate, the metal capable of being converted to an oxide by anodic oxidation;

b. disposing an anodization mask on selected surface areas of the layer of metal;

c. anodizing in situ the entire unmasked portions of the layer of metal to form an oxide of the metal;

d. removing the anodization mask from the selected areas of the layer of metal;

e. removing the unanodized portions of the layer of metal by selective etching to produce windows in the oxidized metal layer and to expose selective surface areas of the one major opposed surface of the substrate; and f. diffusing selected dopant atoms into the exposed selective surface areas of the substrate to form at least two spaced regions of second type semiconductivity separated by a volume of first type semiconductivity material, the volume having a surface area comprising in part, the one major surface of the substrate upon which is disposed, and precisely aligned therebetween, a portion of the anodized metal layer.

2. The method of claim 10 wherein the metal film is an aluminum film.

3. The method of claim 2 wherein the aluminum film is anodized in situ in an anodizing solution containing oxalic acid and propylene glycol.

4. The method of claim 10 wherein the anodization mask is a photoresist anodization mask.

5. A method of forming an aligned gate electrode of a metal-oxide-semiconductor field effect transistor, in a first conductivity semiconductor substrate comprising:

a. diffusing selected second conductivity producing dopant atoms through an electrically insulative diffusion mask into selected areas of said first conductivity semi-conductor substrate to form second conductivity source and drain regions in selected areas of said first conductivity semiconductor substrate, with a portion of said electrically insulative diffusion mask which is between said source and drain electrodes being an aligned electrically insulative gate insulator layer;

b. forming a metal film upon the masked first conductivity semiconductor substrate, said metal film thus being in contact with said second conductivity source and drain regions and said aligned electrically insulative gate insulator layer;

c. masking selected areas of said metal film with an anodization mask, at least two of which selected areas are over the central portions of said second conductivity source and drain regions, and at least one of which selected area of said metal film is above said aligned electrically insulative gate insulator layer; and d. anodizing the selectively masked metal film in situ to delineate a metal source electrode connected to said second conductivity source region, a metal drain electrode connected to said second conductivity drain region and an aligned metal gate electrode above the aligned electrically insulative gate insulator layer.

6. A method of making an improved metal-oxide-semiconductor field effect transistor having an aligned gate electrode in a first conductivity semiconductor substrate, comprising:

a. forming a first aluminum film on said first conductivity semiconductor substrate;

b. masking with an anodization mask selected areas of said first aluminum film including at least two selected areas, in which second conductivity source and drain regions of metal-oxide semiconductor field effect transistors are to be formed in said first conductivity semiconductor substrate;

c. anodizing the selectively masked first aluminum film, which first aluminum film is on said first conductivity semiconductor substrate, into electrically insulative aluminum oxide;

d. removing said mask from the unanodized portions of the first aluminum film;

e. etching away the unanodized aluminum areas from said first conductivity semiconductor substrate to leave an aluminum oxide diffusion mask on said first conductivity semiconductor substrate;

f. diffusing selected second conductivity producing dopant atoms through the aluminum oxide diffusion mask into said first conductivity semiconductor substrate, to form second conductivity source and drain regions in said first conductivity semiconductor substrate and to delineate an aligned aluminum oxide gate insulator layer between said source and drain regions;

g. forming a second aluminum film upon said second conductivity semiconductor substrate, said second aluminum film also being in contact with said aluminum oxide diffusion mask, with said second conductivity source and drain regions, and in contact with said aluminum oxide gate insulator layer;

h. masking selected areas of said second aluminum film, with an anodization mask including at least selected areas over central portions of said second conductivity source and drain regions, and also above said aluminum oxide gate insulator layer between said second conductivity source and drain regions; and i. anodizing the selectively masked second aluminum film to delineate an aluminum source electrode connected to said second conductivity source region, an aluminum drain electrode connected to said second conductivity drain region and an aligned aluminum gate electrode upon said aligned aluminum oxide gate insulator layer, said aligned aluminum gate electrode being precisely aligned between the second conductivity source and drain regions, to thus form an improved metal-oxide-semiconductor field effect transistor.

* * * * *

UNITED STATES PATENT OFFICE
CERTIFICATE OF CORRECTION

Patent No. 3,775,262 Dated November 27, 1973

Inventor(s) Norman E. Heyerdahl

It is certified that error appears in the above-identified patent and that said Letters Patent are hereby corrected as shown below:

Column 5, line 15, delete "10" and insert -- 1 --.

Column 5, line 20, delete "10" and insert -- 1 --.

Signed and sealed this 21st day of May 1974.

(SEAL)
Attest:

EDWARD M.FLETCHER,JR.
Attesting Officer

C. MARSHALL DANN
Commissioner of Patents